United States Patent [19]

Setsune et al.

[11] Patent Number: 4,980,339
[45] Date of Patent: Dec. 25, 1990

[54] SUPERCONDUCTOR STRUCTURE

[75] Inventors: Kentaro Setsune, Sakai; Takeshi Kamada, Ikeda; Hideaki Adachi, Neyagawa; Kiyotaka Wasa, Nara; Takashi Hirao, Moriguchi; Osamu Yamazaki, Toyonaka; Hidetaka Higashino, Matsubara, all of Japan

[73] Assignee: Matsushita Electric Industrial Co., Ltd., Osaka, Japan

[21] Appl. No.: 223,658

[22] Filed: Jul. 25, 1988

[30] Foreign Application Priority Data

Jul. 29, 1987 [JP] Japan .................................. 62-189281
Aug. 21, 1987 [JP] Japan .................................. 62-208632
Aug. 21, 1987 [JP] Japan .................................. 62-208649

[51] Int. Cl.$^5$ .............................................. B32B 1/00
[52] U.S. Cl. ...................................... 505/1; 428/688; 428/699; 428/700; 428/730; 505/701; 505/702; 505/703; 505/704
[58] Field of Search .................. 29/588; 428/688, 699, 428/700, 930; 505/1, 701-704

[56] References Cited

FOREIGN PATENT DOCUMENTS 0292125 4/1988 European Pat. Off. .
0292959 5/1988 European Pat. Off. .
0300499 7/1988 European Pat. Off. .

OTHER PUBLICATIONS

R. H. Hammond et al, "Superconducting thin films of the perovskite superconductors by electron beam deposition," Proceedings of Symposium S, Extended Abstracts, High Temperature Superconductors, MRS Pittsburgh, U.S., pp. 169-171, 23rd-24th Apr. 1987.

S. R. Ovshinsky et al, "Superconductivity at 155K," Physical Review Letters, vol. 58, No. 24, New York, U.S.A., pp. 2579-2581, 15th Jun. 1987.

P. Chaudhari et al, "Critical-Current Measurements in Epitaxial Films of YBa2Cu307-x Compound," Physical Review Letters, vol. 58, No. 25, pp. 2584-2686, 22nd Jun. 1987.

Formation of High T$_c$ YBa$_2$Cu$_3$ O$_{7-\delta}$ Films on Y$_2$Ba-CuO$_5$ substrate Jap. of Journ. Appl. Phys., vol. 27, No. 7 Jul. 1988, L1268-L1270.

Primary Examiner—Patrick Ryan
Attorney, Agent, or Firm—Stevens, Davis, Miller & Mosher

[57] ABSTRACT

A superconductor structure of very high performance is realized by forming a crystalline coating on a substrate of semiconductor, etc. and epitaxially depositing a crystalline superconductor film of good quality on this crystalline coating. Especially, CaF$_2$ crystal and ZrO$_2$ crystal of CaF$_2$ crystal structure have lattice constants which match well with the substrate such as Si, GaAs, etc. and the superconductor. The crystalline coating may be a perovskite material such as BaTiO$_3$ when the superconductor is a perovskite material.

8 Claims, 1 Drawing Sheet

SUPERCONDUCTOR STRUCTURE

BACKGROUND OF THE INVENTION

This invention relates to a superconductor, and more particularly to a compound thin film superconductor.

Recently, it was proposed that the materials of a Y-Ba-Cu-O system are higher temperature superconductors [M. K. Wu et al, Physical Review Letters Vol. 58, No. 9, 908-910 (1987)].

More recently, materials of a Bi—Sr—Ca—Cu—O system were found to be electrically superconducting above 100° K., and materials of a Tl—Ba—Ca—Cu—O system exhibiting zero electrical resistance at still higher temperature were successively found.

The details of the superconductivity mechanism of these high Tc superconducting oxides are not clear, but there are possibilities that the transition temperature of these materials may become higher than the room temperature. Superior performances to the conventional binary compounds as the electrical superconductor are expected.

These high Tc superconducting oxides, however, can only be made, at the current technology, through the step of sintering. Therefore, these materials are only available in the forms of ceramic powders or ceramic blocks.

For bringing materials of this kind into practical use, it is strongly desired that the materials are shaped in thin films or in wires. At the current technology, tested specimens are poor in reproducibility and reliability. It is generally considered that good superconducting films and/or wires of these materials are very hardly supplied. Further, the films of these materials are formed on single crystal substrates and the cost of the substrate is expensive.

SUMMARY OF THE INVENTION

The present inventors have found that high Tc superconductor thin films of good quality of these materials can be formed by using a thin film technique, such as sputtering, and specially designing the interface structure of the superconductor film, and have invented a novel superconductor structure based on this finding.

In the superconductor structure, a compound coating made of an oxide containing a, b and Cu, where the atomic ratio of the elements a, b and Cu satisfies $$0.5 \leq \frac{a+b}{Cu} \leq 2.5,$$

is deposited on a crystalline film-coated-substrate. Here, a represents at least one species selected from the group consisting of Tl, Bi, Sc, Y and Lanthanide elements (atomic numbers 57-71), and b is at least one species selected from the group consisting of group IIa elements of the periodic table such as Ba, Sr, Ca, Be, Mg.

The superconductor structure according to this invention is markedly featured by the fact that the superconductor is formed in the shape of thin film on a substrate which is provided with a crystalline coating. Namely, regarding the film formation, when the superconductor materials once decomposed into extremely fine particles of atomic state are directly deposited on a non-crystalline or amorphous substrate, it is often difficult to obtain superconductor films of good quality. On a substrate covered with a crystalline coating, however, a crystalline superconductor film of good quality is allowed to epitaxially deposit. Therefore, a superconductor conductor of very high performance can be realized according to the invention.

DESCRIPTION OF THE PREFERRED EMBODIMENTS

Figure 1:
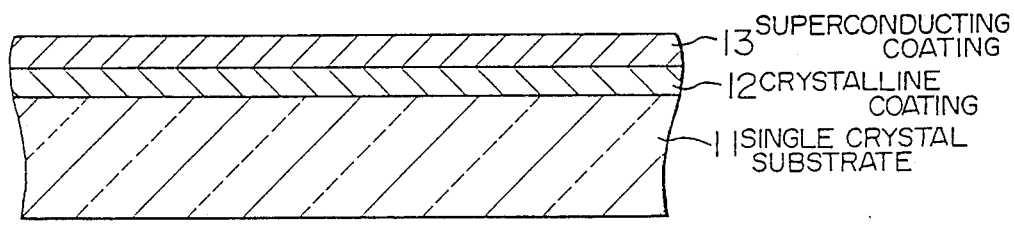
FIG. 1 is a cross-section of a superconductor structure according to an embodiment of the invention.

Now, a detailed description on the preferred embodiments of the invention will be made in connection with the accompanying drawing.

In FIG. 1, a superconductor coating 13 is formed for example by sputtering on a calcium fluoride crystalline coating 12 which is formed in a film on a surface of a single crystal substrate 11 of for example silicon. Here, the substrate 11 is aimed to support the superconductor coating 13 which exhibits the superconductivity. This coating 13 is formed usually at a high temperature of 700° C. When a superconductor material film was deposited directly on a substrate 11 without the crystalline coating 12, for example silicon atoms of the substrate 11 diffused into the superconductor coating. The electrical resistivity became extremely large and the superconducting properties were lost. When a calcium fluoride thin film 12 was inserted between the silicon substrate 11 and the superconductor coating, an oriented good quality superconductor film 13 was made. The present inventors have confirmed that as the material of the crystalline coating 12 of FIG. 1, crystals of $CaF_2$ type crystal structure such as barium fluoride $BaF_2$, strontium fluoride $SrF_2$, as well as calcium fluoride $CaF_2$ are effective.

Further, it was confirmed that zirconia $ZrO_2$ having the $CaF_2$ type crystal structure is effective and that zirconia compounds such as stabilized zirconias in which zirconia is stabilized by oxides of rare earth elements such as $Y_2O_3$, $Sm_2O_3$, $Gd_2O_3$, $La_2O_3$, $Nd_2O_3$, etc. and MgO, CaO, and $TiO_2$.

The superconductor coating employed in this invention is made of a crystal of perovskite crystal structure. It was confirmed that titanate type crystals such as $BaTiO_3$, $SrTiO_3$, $CaTiO_3$, etc., perovskite type oxides such as niobates of elements K, Na and Ag, tantalates of elements K, Na and Ag, or $CdTiO_3$, etc., both having the perovskite crystal structure are effective. As seen from Example 3 below, the crystalline coating can also have a perovskite crystal structure (calcium titanate) so that the crystalline and superconductor coatings can have similar crystal structures.

Further, the present inventors have found that as the substrate 11 of FIG. 1, semiconductor single crystal bodies of germanium Ge, gallium arsenide GaAs, gallium phosphide GaP, gallium nitride GaN, indium arsenide InAs, indium phosphide InP, indium antimonide InSb, cadmium sulfide CdS, zinc selenide ZnSe, zinc sulfide ZnS, etc. are effective as well as silicon Si.

Namely, it was found that for forming a highly crystalline superconductor coating 13 on a surface of a single crystal semiconductor substrate 11, it is only necessary to form a film of a high Tc superconductor oxide on a substrate having a crystalline coating of the $CaF_2$ type or perovskite type crystal structure.

The superconductor a—b—Cu—O system used in this invention is not yet clearly determined its crystal structure nor its chemical composition formula, but is also called oxygen-defect perovskite. The present inventors have confirmed that the superconducting phenomena are observed when the molar ratio of the elements in the film is in the range of $$0.5 \leq \frac{a+b}{Cu} \leq 2.5,$$

even when there are some differences in the critical temperature.

Further, it was confirmed that when element a is constituted by Tl or Bi, superconducting phenomena are observed if element b includes at least two species of group IIa elements of the periodic table and the atomic ratio of the elements with a representing the sum of at least two group IIa elements, is in the range of the formula described above.

In sputtering deposition, sintered a—b—Cu—O ceramics is used as the target. When the substrate temperature is 700° C., there was observed a tendency that Cu is short in the deposited film when comparing the compositions of the target and the deposited film. The present inventors have confirmed that Cu may be contained in the target about 50% in excess to obtain good results. Therefore, the optimum composition of the target was found to lie in $$0.3 \leq \frac{a+b}{Cu} \leq 1.7.$$

Here, the target for use in the sputtering deposition may also be in the form of granular or powder sintered bodies as well as in the form of plate ceramics or cylinder ceramics.

EXAMPLE 1

Using (100) oriented silicon single crystal as the substrate 11, calcium fluoride coating 12 was deposited on the substrate 11 by vacuum deposition. Here, the substrate 11 was kept at a temperature in the range of 500°-600° C., and the coating was grown to a thickness of 0.1 μm. The obtained film was (100)-oriented, single crystal, calcium fluoride electrical insulator. A coating 13 was deposited on this calcium fluoride coating 12 by rf planar magnetron sputtering of a sintered $ErBa_2Cu_{4.5}O_8$ target. Here, the atmosphere was Ar gas at a pressure of 0.5 Pa, the sputtering power was 150 W, the sputtering time was 2 hours, the thickness of the coating was 0.5 μm, and the substrate temperature was 700° C.

The obtained coating [0.5 μm (H)×1 mm (W)×1 mm (L)] was a (002)-oriented crystalline film which has a room temperature resistance of 30Ω and a superconductivity transition temperature of 90° K. The lattice constant of calcium fluoride is 5.8 Å with a face-centered cubic structure. The atom-to-atom (i.e. corner atom to face center atom) distance is 3.8 Å, which meets the lattice of the Er—Ba—Ca—O system superconductors, and is considered to allow production of a good crystalline superconductor body.

EXAMPLE 2

Using (100)-oriented single crystal silicon wafer as the substrate 11, a stabilized zirconia coating 12 was deposited by vacuum deposition. Here, the substrate was kept at a temperature in the range of 500°-600° C., and the coating was grown to a thickness of 0.1 μm. The obtained film was a (100)-oriented, stabilized zirconia single crystal, electrical insulator. A coating 13 was deposited on this stabilized zirconia coating 12 by rf planar magnetron sputtering of a sintered $ErBa_2Cu_{4.5}O_8$ target. Here, the pressure of Ar gas was 0.5 Pa, the sputtering power was 150 W, the sputtering time was 2 hours, the thickness of the coating was 0.5 μm, and the substrate temperature was 700° C.

The obtained coating [0.5 μm (H)×1 mm (W)×1 mm (L)] was a crystalline film of (002) orientation, and had a room temperature resistance of 30Ω, and a superconductivity transition temperature of 90° K. Here, the lattice constant of the stabilized zirconia is about 5.05-5.3 Å with a fluorite type face-centered cubic crystal structure. The atom-to-atom (i.e. corner atom to face-center atom) distance is about 3.6 Å, which is very slightly smaller than the lattice constant of the Er—Ba—Cu—O system superconductor, hence has an effect of inducing strain in the Er—Ba—Cu—O system superconductor, and is considered to allow production of good crystalline superconductor.

EXAMPLE 3

Calcium titanate $CaTiO_3$ coating 12 was deposited by sputtering on a substrate 11 of (100)-oriented silicon single crystal wafer. Here, the substrate temperature was held in a temperature range of 500°-600° C., and the deposition was done to a film thickness of 0.1 μm. The obtained film was an electrical insulator of calcium titanate single crystal. A coating 13 was deposited on this calcium titanate coating by rf planar magnetron sputtering of a $ErBa_2Cu_{4.5}O_8$ target. Here, the Ar gas pressure was 0.5 Pa, the sputtering power was 150 W, the sputtering time was 2 hours, the thickness of the film was 0.5 μm, and the substrate temperature was 700° C.

The obtained coating [0.5 μm (H=height)×1 mm (L=length)×1 mm (W=width)] was a crystalline film which had a room temperature resistance of 30Ω and a superconductivity transition temperature of 90° K. Calcium titanate has a lattice constant of 3.8 Å. It is considered that this lattice constant meets the lattice constant of the Er—Ba—Cu—O system superconductor and produced a good crystalline superconductor.

Regarding this kind of superconductor a—b—Cu—O, details of the changes in the superconductivity by the changes in the constituent elements a and b are not clear. Description has been made on examples which employ Er as the element a. The intrinsic nature of the present invention, however, does not change when the element a is one of Ti, Bi, Sc, La, and Lanthanide elements (atomic number 57-71), although the superconductivity transition temperature may change.

Also, the intrinsic nature of the present invention does not change when the element b is changed in the group consisting of group IIa elements of the periodic table, such as Sr, Ca, Ba, etc.

The superconductor structure according to this invention is largely featured in the structure that the superconductor body is formed in the shape of a film on an insulator-coated semiconductor substrate. The film is formed through the steps of decomposing the superconductor material into extremely fine particles of atomic state and then depositing them on a substrate. Thus, the produced superconductor body inherently has a more uniform composition compared to the conventional sintered bodies. Therefore, superconductor bodies of very high precision can be realized according to the present invention. Also, it is possible to integrate, in a semiconductor device, superconductor bodies of good quality in crystalline state, for example, being separated by electric insulator films.

Examples are described with (100)-oriented silicon single crystal substrate and a crystalline coating of calcium fluoride, stabilized zirconia, or calcium titanate. Appropriate materials are not limited to these. In case of calcium fluoride, other crystal orientations of silicon, e.g. (111) surface, are also effective. On a (111) oriented silicon surface, a (111) oriented calcium fluoride coating was formed. Using gallium phosphide or zinc sulfide, mostly coincident results to those of silicon case were obtained. This is considered to be due to almost the coincident lattice constant for silicon and gallium phosphide. Similarly, in case when gallium arsenide or germanium is used as the substrate, for example a (111)-plane calcium fluoride film was obtained on a (111)-plane germanium substrate, and an oriented superconductor body was obtained on this calcium fluoride film. Here, however, since the lattice constant of germanium or gallium arsenide is larger than that of calcium fluoride, strain is generated in the calcium fluoride film. The present inventors have confirmed that for removing such strain and realizing a stable film coating, it is effective to use strontium fluoride for the crystalline coating, or a mixture compound of strontium fluoride and calcium fluoride, for example $Ca_{0.44}Sr_{0.56}F_2$ for the crystalline coating. The present inventors have also confirmed that when indium phosphide or cadmium sulfide is used as the substrate, it is especially effective to use strontium fluoride or a mixed compound of strontium fluoride and barium fluoride as the crystalline coating.

In the case of stabilized zirconia, example of using (100)-oriented silicon single crystal as the substrate is described. Other crystal orientations of silicon, e.g. (111) plane, are also effective as the substrate. In case of a (111) silicon plane, a (111) plane zirconia coating was formed thereon. When gallium phosphide or zinc sulfide semiconductor was used as the substrate, mostly coincident results to the silicon substrate case were obtained. This is considered to be ascribed to the substantially coincident lattice constant of silicon and gallium phosphide. In case of using gallium arsenide or germanium, for example when a (111) plane germanium was used as the substrate, a (111) plane zirconia coating was obtained and an oriented superconductor film was obtained on this zirconia coating. Here, however, since the lattice constant of germanium or gallium arsenide is considerably larger than that of zirconia, excessive strain is generated in the zirconia coating. The present inventors have confirmed that for dissolving such strain and realizing a stable coating, it is effective to use a mixed compound of CaO and zirconia as the crystalline coating. Also, the present inventors have confirmed that it is particularly effective to use a mixed compound of CaO and MgO for stabilizing zirconia crystalline coating In the case of calcium titanate, an example of using a (100) silicon single crystal, as the substrate, is described. Other crystal planes of silicon, such as (111) plane, were also effective. When gallium phosphide or zinc sulfide was used as the substrate, mostly coincident results to the silicon substrate case were obtained. This is considered to be ascribed to the substantially coincident lattice constant of silicon and gallium phosphide. Similarly, when gallium arsenide or germanium is used, crystalline calcium titanate was obtained, and an oriented superconductor film was obtained on this calcium titanate coating. However, the lattice constant in the <110> direction of calcium titanate is different from the lattice constant in the <100> direction of germanium or gallium arsenide, strain is generated in the coating. The present inventors have confirmed that for dissolving such strain and realizing a stable coating, it is effective to use strontium titanate or a mixed compound of strontium titanate and calcium titanate for the crystalline coating. The present inventors have also confirmed that when indium phosphide or cadmium sulfide is used as the substrate, it is particularly effective to use strontium titanate or a mixed compound of strontium titanate and barium titanate as the crystalline coating.

The present inventors have confirmed that the above facts are based on the degree of lattice matching between the substrate and the crystalline coating As has been described above, it becomes possible to form dense and good quality superconductor films according to this invention.

It is possible to integrate the superconductor structure with semiconductor devices of Si, GaAs, CdS, etc., by using this invention.

The superconductor structure according to this invention can be practically incorporated in various superconductor devices such as Josephson device.

Particularly, there is a possibility that the transition temperature of the compound superconductor materials of this kind may become or exceed the room temperature. Then, the field of application becomes very broad. The industrial value of this invention is high.

We claim:

1. A superconductor structure comprising:
   a single crystal substrate made of at least one material selected from the group consisting of single crystals of Si, Ge, GaAs, GaN, GaP, InP, InAs, InSb, ZnS, ZnSe and CdS;
   a crystalline coating formed on said single crystal substrate and having a crystal structure selected from the group consisting of $CaF_2$ type crystal structure and perovskite type crystal structure; and
   a superconductor coating made of an oxide of a superconductor a—b—Cu—O system and formed on said crystalline coating wherein the atomic ratio of the elements satisfies $$0.5 \leq \frac{a+b}{Cu} \leq 2.5, \text{ and}$$

a is at least one species selected from the group consisting of Tl, Bi, Sc, Y and Lanthanide elements (atomic numbers 57-71), and b is at least one species selected from the group consisting of group IIa elements of the periodic table.

2. A superconductor structure according to claim 1, wherein said crystalline coating is made of at least one selected from the group consisting of $CaF_2$, $BaF_2$, $SrF_2$, $CaF_2$ structure crystals and the compounds including at least one of these materials.

3. A superconductor structure according to claim 1, wherein said crystalline coating is made $bTiO_3$ where b is at least one species selected from the group consisting of group IIa elements of the periodic table.

4. A superconductor structure according to claim 1, wherein said crystalline coating is made of one selected from the group consisting of $cNbO_3$ and $cTaO_3$ where c is at least one selected from the group consisting of K, Na, and Ag.

5. A superconductor structure according to claim 1 wherein said crystalline coating is made of $CdTiO_3$.

6. A superconductor structure according to claim 2, wherein said crystalline coating is made of one selected from the group consisting of $ZrO_2$ and the compounds including $ZrO_2$.

7. A superconductor structure according to claim 6, wherein said crystalline coating is made of a stabilized compound of $ZrO_2$ stabilized by at least one of rare earth metal oxides such as $Y_2O_3$, $Sm_2O_3$, $Gd_2O_3$, $La_2O_3$, and $Nd_2O_3$.

8. A superconductor structure according to claim 6, wherein said crystalline coating is made of a stabilized compound of $ZrO_2$ stabilized by at least one selected from the group consisting of MgO, CaO and $TiO_2$.

* * * * *